United States Patent
Lee et al.

(10) Patent No.: US 7,280,381 B2
(45) Date of Patent: Oct. 9, 2007

(54) APPARATUS AND METHODS FOR OPTICALLY-COUPLED MEMORY SYSTEMS

(75) Inventors: Terry R. Lee, Boise, ID (US); Kevin J. Ryan, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 11/152,978

(22) Filed: Jun. 14, 2005

(65) Prior Publication Data

US 2005/0232062 A1    Oct. 20, 2005

Related U.S. Application Data

(62) Division of application No. 10/351,077, filed on Jan. 23, 2003, now Pat. No. 6,961,259.

(51) Int. Cl.
*G11C 5/06* (2006.01)

(52) U.S. Cl. ............ 365/63; 365/174; 365/64; 385/88; 385/90; 385/92; 385/94; 257/98; 257/432

(58) Field of Classification Search ............ 365/63, 365/174, 64; 385/88, 89, 90, 92; 257/88, 257/432, 98
See application file for complete search history.

(56) References Cited

U.S. PATENT DOCUMENTS

| | | | |
|---|---|---|---|
| 5,391,917 A | 2/1995 | Gilmour et al. | 257/690 |
| 5,933,608 A | 8/1999 | Osmon | 709/243 |
| 6,100,026 A | 8/2000 | Nova et al. | 435/6 |
| 6,424,034 B1 | 7/2002 | Ahn et al. | 257/723 |
| 6,453,377 B1 | 9/2002 | Farnworth et al. | 710/300 |
| 6,516,121 B2 | 2/2003 | Laor | 385/49 |
| 6,731,515 B2 | 5/2004 | Rhoads | 361/796 |
| 6,754,117 B2 | 6/2004 | Jeddeloh | 365/201 |
| 6,787,825 B1 | 9/2004 | Gudesen et al. | 257/278 |
| 6,793,408 B2 | 9/2004 | Levy | 385/88 |
| 6,811,320 B1 | 11/2004 | Abbott | 385/58 |
| 6,869,320 B2 | 3/2005 | Haas et al. | 439/701 |
| 6,961,259 B2 * | 11/2005 | Lee et al. | 365/63 |
| 6,982,892 B2 * | 1/2006 | Lee et al. | 365/63 |

(Continued)

FOREIGN PATENT DOCUMENTS

JP    401068141    3/1989

(Continued)

*Primary Examiner*—Viet Q. Nguyen
(74) *Attorney, Agent, or Firm*—Dorsey & Whitney LLP

(57) ABSTRACT

Optically-coupled memory systems are disclosed. In one embodiment, a system memory includes a carrier substrate, and a controller attached to the carrier substrate and operable to transmit and receive optical signals, and first and second memory modules. The module substrate of the first memory module has an aperture formed therein, the aperture being operable to provide an optical path for optical signals between the controller and an optical transmitter/receiver unit of the second memory module. Thus, the system memory provides the advantages of "free space" optical connection in a compact arrangement of memory modules. In an alternate embodiment, the first memory module includes a beam splitter attached to the module substrate proximate the aperture. In another embodiment, the first and second memory modules are staged on the carrier substrate to provide an unobstructed path for optical signals. In another embodiment, the optical transmitter/receiver unit projects outwardly from the module substrate to provide an unobstructed path for optical signals.

18 Claims, 5 Drawing Sheets

U.S. PATENT DOCUMENTS

| | | | |
|---|---|---|---|
| 7,047,351 B2 | 5/2006 | Jeddeloh | 711/5 |
| 7,099,585 B2 | 8/2006 | Cordes et al. | 398/60 |
| 7,102,907 B2* | 9/2006 | Lee et al. | 365/63 |
| 7,200,024 B2* | 4/2007 | Taylor | 365/64 |
| 2003/0030859 A1 | 2/2003 | Youn et al. | 359/110 |
| 2004/0156640 A1 | 8/2004 | Dress et al. | 398/140 |
| 2005/0243589 A1* | 11/2005 | Lee et al. | 365/63 |
| 2005/0243590 A1* | 11/2005 | Lee et al. | 365/63 |
| 2005/0243591 A1* | 11/2005 | Lee et al. | 365/63 |
| 2006/0215434 A1* | 9/2006 | Lee et al. | 365/63 |

FOREIGN PATENT DOCUMENTS

| | | |
|---|---|---|
| JP | 08293836 A | 11/1996 |
| JP | 11039069 A | 2/1999 |
| JP | 2002342109 A | 11/2002 |

* cited by examiner

APPARATUS AND METHODS FOR OPTICALLY-COUPLED MEMORY SYSTEMS

CROSS-REFERENCE TO RELATED APPLICATION

This application is a divisional of U.S. patent application Ser. No. 10/351,077, filed Jan. 23, 2003, now U.S. Pat. No. 6,961,259.

TECHNICAL FIELD

The present invention relates to memory systems, and more particularly to novel apparatus and methods for optically-coupled memory systems.

BACKGROUND OF THE INVENTION

A conventional computer system 10 shown in FIG. 1 includes a central processing unit ("CPU") 12, such as a microprocessor, that is coupled to a bus bridge 16, memory controller or the like. The CPU 12 is also typically coupled to a cache memory 18 to allow instructions and data to be more frequently accessed by the CPU 12. The bus bridge 16 allows the CPU 12 to receive program instructions from a system memory 20. The CPU 12 can also write data to and read data from the system memory 20 through the bus bridge 16. The CPU 12 also preferably transfers video data from the system memory 20 to a display system including a graphics processor or graphics accelerator 24, a video RAM 26, and a conventional display 28, such as a cathode ray tube ("CRT"), liquid crystal display ("LCD") or field emission display ("FED"). The graphics accelerator 24 processes graphics data to free up the CPU 12 from performing that function. The graphics accelerator 24 writes video data to and reads video data from the video RAM 26, and generates a video signal that is applied to the display 28. The bus bridge 16 also interfaces the CPU 12 to a peripheral bus 30, such as a peripheral component interconnect ("PCI") bus. The peripheral bus 30 is, in turn, coupled to at least one mass storage device, such as a disk drive 32 and a CD ROM drive 34, and at least one user interface device, such as a keyboard 36 and a pointing device 38. The computer system 10 may, of course, contain a greater or lesser number of components.

As shown in FIG. 2, the system memory 20 is generally in the form of one or more memory modules 44 that includes several integrated circuit memory devices 40, such as dynamic random access memories ("DRAMs") and which may be Advanced Technology ("AT") Drams, such as RAMBUS DRAMs ("RDRAMs") or synchronous link DRAMs ("SLDRAMs"), mounted on a printed circuit board 42. Typically, the memory modules 44 are removably plugged into a motherboard 46 of a computer system 10 (FIG. 1). The size of the computer system's memory can be increased by simply plugging additional memory modules 44 into the motherboard 46. Memory modules 44 are commercially available in standardized configurations, such as a single in-line memory module ("SIMM") and a double in-line memory module ("DIMM"). The memory modules 44 are electrically coupled to a memory controller 50 or other device (not shown) mounted on the mother-board 46 using standardized memory interfaces 52. These standardized memory interfaces 52 generally include a data bus, an address bus, and a control/status bus.

Although desirable results have been achieved using conventional system memories 20 of the type described above, there is room for improvement. For example, when the controller 50 (FIG. 2) transmits signals to the memory modules 44 via the memory interface 52 to access data stored in the memory devices 40, the memory interface 52 may experience undesirable noise from parasitic effects, including, for example, reflections of the electrical signals from the interface connections along the memory interface 52, or electromagnetic interference from neighboring components. Typically, the operation of the system memory 20 is slowed by these parasitic effects because the system memory 20 must wait between the time access signals are sent and data signals are received to allow the reflections and noise to dampen.

Optically-based system memories may provide improved performance over conventional system memories 20. Optically-based system memories include fiber-optically connected systems of the type generally disclosed, for example, in U.S. Pat. No. 6,250,819 issued to Porte et al., and U.S. Pat. No. 6,301,401 issued to La, and "free space" or "line-of-sight" optically-connected systems of the type generally disclosed, for example, in U.S. Pat. No. 5,500,523 issued to Hamanaka, and U.S. Pat. No. 6,380,527 issued to Davis. Problems of transmitting and receiving optical signals between the memory controller 50 and the memory modules 44, however, continue to hamper the commercialization of optically-based system memories, particularly those systems having an array of parallel, closely-spaced memory modules of the type found in many existing personal computer systems.

SUMMARY OF THE INVENTION

The present invention is directed to apparatus and methods for optically-coupled memory systems. In one aspect, a system memory includes a carrier substrate, and a controller attached to the carrier substrate and operable to transmit and receive optical signals, and first and second memory modules. The module substrate of the first memory module has an aperture formed therein, the aperture being adapted to provide an optical path for optical signals between the controller and an optical transmitter/receiver unit of the second memory module. Thus, the system memory provides the advantages of "free space" optical connection in a compact arrangement of memory modules.

In an alternate aspect, the first memory module includes a beam splitter attached to the module substrate proximate the aperture. The beam splitter is operable to transmit a first portion of an incident optical signal from the controller through the aperture to the second memory module, and also to reflect a second portion of the incident optical signal to an optical transmitter/receiver unit of the first memory module.

In another aspect, a system memory includes first and second memory modules that are staged on a carrier substrate such that the second memory module is offset from the first memory module along the longitudinal axis of the second memory module by an amount sufficient to provide an unobstructed path for optical signals between a controller and an optical transmitter/receiver unit of the second memory module.

In yet another aspect, a system memory includes a carrier substrate, a controller attached to the carrier substrate, and a memory module that has an optical transmitter/receiver unit that projects outwardly from the module substrate to provide an unobstructed path for optical signals between the controller and the optical transmitter/receiver unit. In an alternate aspect, the optical transmitter/receiver unit projects outwardly from the first module substrate by a distance that exceeds a height of a memory device attached to the module substrate.

DETAILED DESCRIPTION OF THE INVENTION

The present description is generally directed toward novel apparatus and methods for optically-coupled memory systems. Many specific details of certain embodiments of the invention are set forth in the following description and in FIGS. 3–11 to provide a thorough understanding of such embodiments. One skilled in the art will understand, however, that the present invention may have additional embodiments, or that the present invention may be practiced without several of the details described in the following description.

Figure 3:
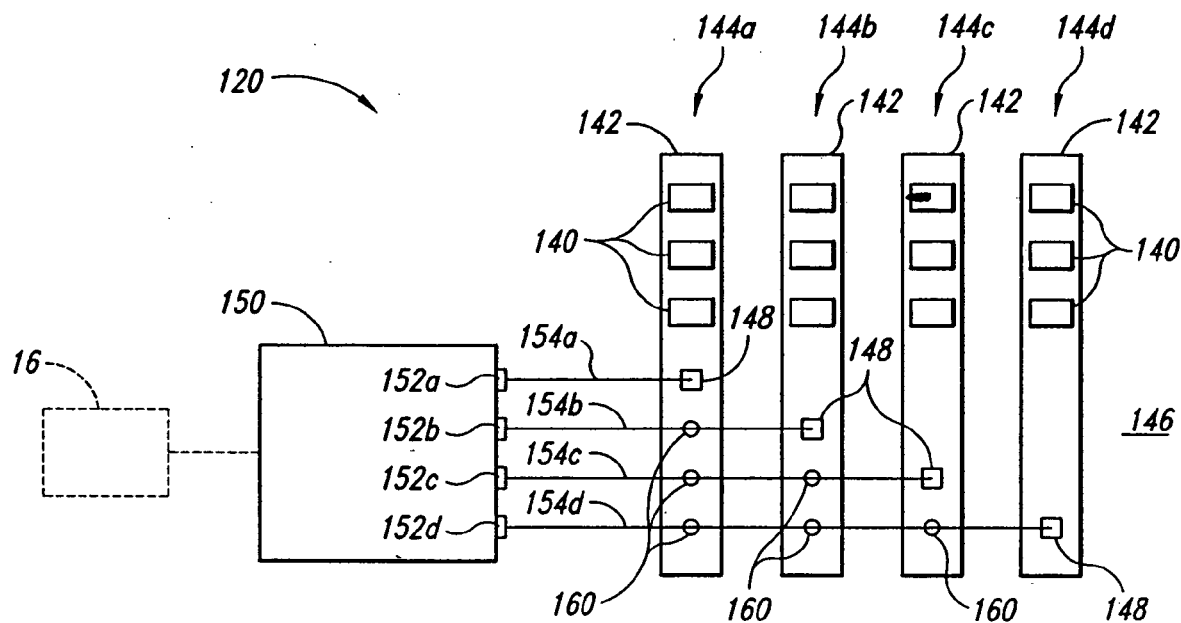
FIG. 3 is a top schematic view of a system memory having memory modules with apertures in accordance with an embodiment of the invention.

FIG. 3 is a top schematic view of a system memory 120 in accordance with an embodiment of the invention. For clarity, the system memory 120 shown in FIG. 3 is not drawn to scale. The system memory 120 includes a plurality of memory modules 144 mounted on a carrier substrate (or motherboard) 146. The memory modules 144 may be removably plugged into the motherboard 146 in the conventional manner. Each memory module 144 includes a module substrate 142. As described more fully below, the module substrates 142 of the memory modules 144a, 144b, 144c have one or more apertures 160 disposed therethrough. Specifically, in the embodiment shown in FIG. 3, the first memory module 144a has three apertures 160, the second memory module 144b has two apertures 160, and the third memory module 144c has one aperture 160 disposed therethrough. The fourth memory module 144d in this embodiment has no apertures 160.

As further shown in FIG. 3, a plurality of integrated circuit memory devices 140 (three shown) are attached to the module substrate 142 of each memory module 144. The memory devices 140 may be of any conventional type, including dynamic random access memories ("DRAMs"), and Advanced Technology ("AT") DRAMs, such as RAMBUS DRAMs ("RDRAMs") or synchronous link DRAMs ("SLDRAMs").

Figure 1:
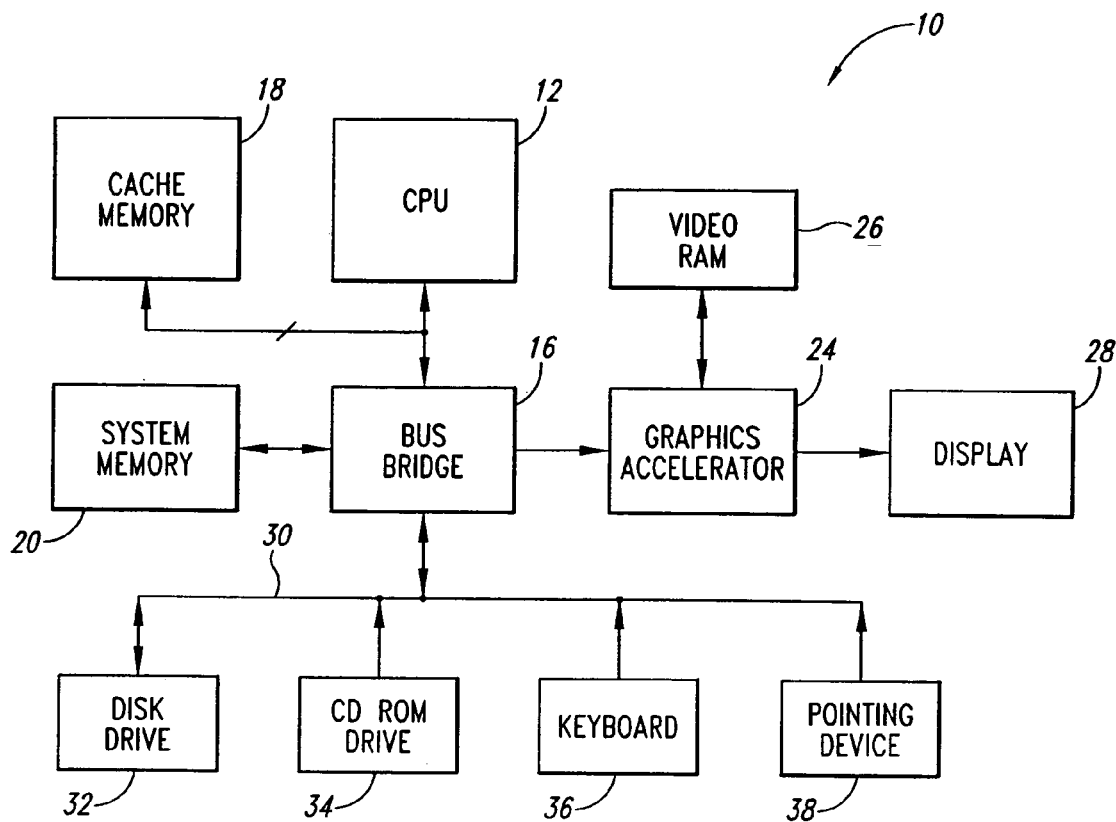
FIG. 1 is a block diagram of a conventional computer system having a system memory.
Figure 2:
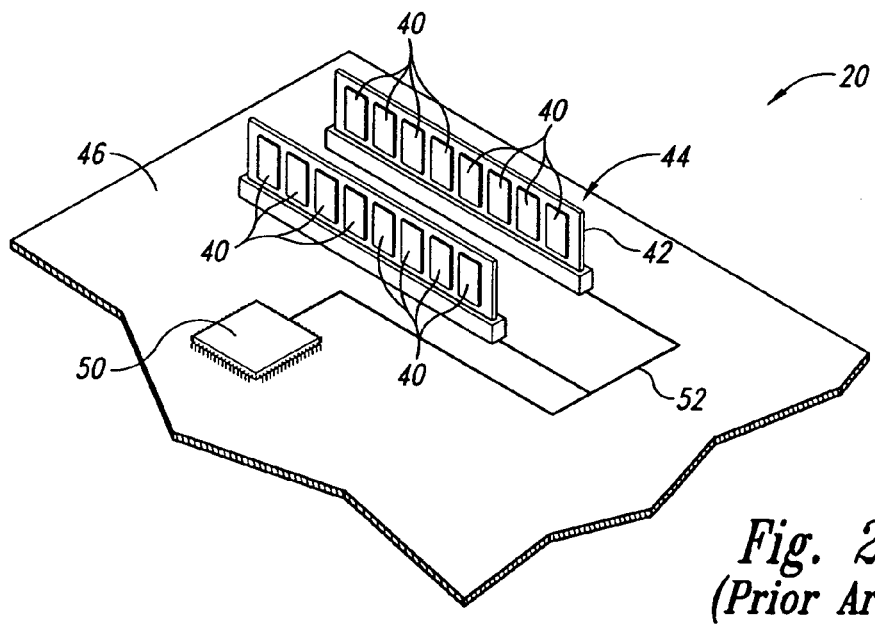
FIG. 2 is an isometric view of a conventional system memory that may be used in the computer system of FIG. 1.

A controller 150 is attached to the carrier substrate 146 proximate the first memory module 144a. The controller 150 may be coupled to a bus bridge 16 (FIG. 1) or other standardized memory interface 52 to connect the system memory 120 with a CPU or other external components. The controller 150 is equipped with several communications units 152 that transmit optical signals to and receive optical signals from the memory modules 144. Each communications unit 152 includes one or more converters (not shown) that convert incoming electrical signals from the bus bridge 16 into optical signals for transmission to the memory modules 144, and also one or more converters that convert incoming optical signals from the memory modules 144 into outgoing electrical signals to the bus bridge 16. A variety of known devices may be employed to perform these functions, including light emitting diodes (LEDs), laser diodes, photodiodes, p-i-n diodes, or other electricity-to-light and light-to-electricity conversion devices.

As further shown in FIG. 3, a transmitter/receiver (T/R) unit 148 is attached to each module substrate 142. Each T/R unit 148 is operatively coupled by electrical circuits (not shown) to the memory devices 140 on the corresponding module substrate 142. The T/R units 148 are known devices that receive and transmit optical signals. The T/R units 148 include one or more converters (not shown) that convert incoming optical signals from the communications units 152 into electrical signals for transmission to the memory devices 140, and also one or more converters that convert incoming electrical signals from the memory devices 140 into outgoing optical signals (corresponding to data values stored in the memory devices 140) to the communications units 152.

In operation, the controller 150 receives a memory request signal from an external device, such as the CPU 12 via the bus bridge 16. The controller 150 analyzes the memory request signal using known control algorithms to determine which memory module 144 corresponds to the memory request signal, then converts the memory request signal into an optical signal and transmits the optical signal from one of the communications units 152 to the T/R unit 148 of the appropriate memory module 144. Alternately, the controller 150 may simply convert the memory request signal directly into an optical signal and transmit the optical signal to all of the memory modules 144, allowing the memory modules 144 to analyze the optical signal, and the appropriate memory module 144 to respond accordingly. In either case, the optical signals transmitted from the controller 150 to the first, second, third, and fourth memory modules 144a, 144b, 144c, 144d travel along first, second, third, and fourth optical paths 154a, 154b, 154c, 154d, respectively. As shown in FIG. 3, the second, third, and fourth optical paths 154b, 154c, 154d extend through one or more of the apertures 160 disposed within the first, second, and third memory modules 144a, 144b, 144c.

In alternate modes of operation, the optical signals may traverse the optical paths 154 sequentially, simultaneously, or a combination of both. In other words, in a first mode of operation, the controller 150 may transmit a memory request signal along the second optical path 154b to the second memory module 144b, and then wait to receive the incoming optical signal transmitted from the T/R unit on the second memory module 144b prior to transmitting a second memory request signal to the second memory module 144b. In an alternate, second mode of operation, however, the memory access signals sent by the controller 150 to the second memory module 144b, and the optical signals corresponding to the stored data values sent by the second memory module 144b to the controller 150, may traverse the second optical path 154b simultaneously. In a third more of operation, a combination of sequential and simultaneous optical signal transmission may be employed.

The system memory 120 advantageously allows a "free space" or "line-of-sight" optical connection between the controller 150 and the individual memory modules 144 of an array of parallel, closely-spaced memory modules 144 of the type found in many existing personal computer systems. Because the first, second, and third memory modules 144a, 144b, 144c have one or more apertures 160 disposed therethrough, unobstructed optical pathways are created between the communications units 152 and the T/R units 148 for the second, third, and fourth optical paths 154b, 154c, 154d. The advantages of free space or line-of-sight optical connection between the controller 150 and the individual memory modules 144 are thereby achieved without the use of mirrors, refraction devices or other relatively complex optical components.

It should be noted that the system memory embodiment depicted in FIG. 3 is merely illustrative, and that many particular details of the system memory 120 may be varied without departing from the spirit or scope of the invention. For example, a greater or fewer number of memory modules 144 may be used, and the memory modules 144 need not be oriented in an approximately parallel fashion as shown in FIG. 3. Each memory module 144 may have a greater or fewer number of memory devices 140, a greater or fewer number of apertures 160, or a greater number of T/R units 148.

Alternate embodiments of system memories in accordance with the invention will be described below. In general, many of the components and operational characteristics of the alternate embodiments are the same as those described above with respect to the system memory 120. Therefore, in the following discussion, the reference numerals used to designate particular components will be similar to or the same as the reference numerals used to refer to the same or similar components of the previously-described system memory 120. For purposes of clarity, and to avoid undue repetition, only the significantly different aspects or operational features of each alternate embodiment will be discussed in detail.

Figure 4:
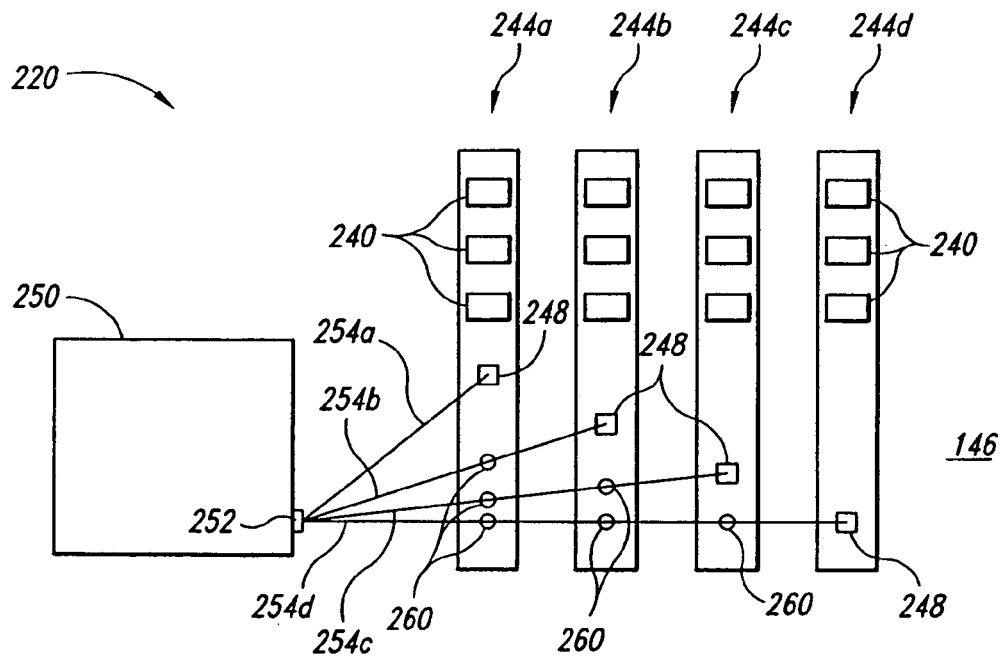
FIG. 4 is a top schematic view of a system memory having memory modules with apertures in accordance with another embodiment of the invention.

FIG. 4 is a top schematic view of a system memory 220 in accordance with an alternate embodiment of the invention. In this embodiment, the controller 250 includes a single communications unit 252 that is operable to transmit and receive optical signals to and from the T/R units 248 of all of the memory modules 244. As in the previously disclosed embodiment, the first, second, and third memory modules 244a, 244b, 244c have one or more apertures 260 disposed therethrough to provide unobstructed optical paths 254b, 254c, 254d between the communications unit 252 and the T/R units 248 of the second, third, and fourth memory modules 244b, 244c, 244d. Since the optical paths 254 are transmitted from the common communications unit 252, the apertures 260 of successive memory modules 244 are aligned along radial pathways extending outwardly from the communications unit 252 to the T/R units 248. Thus, the above-noted advantages of "free space" or "line-of-sight" optical connection between the controller 250 and the individual memory modules 244 are achieved using a controller 250 having a single communications unit 252.

Figure 5:
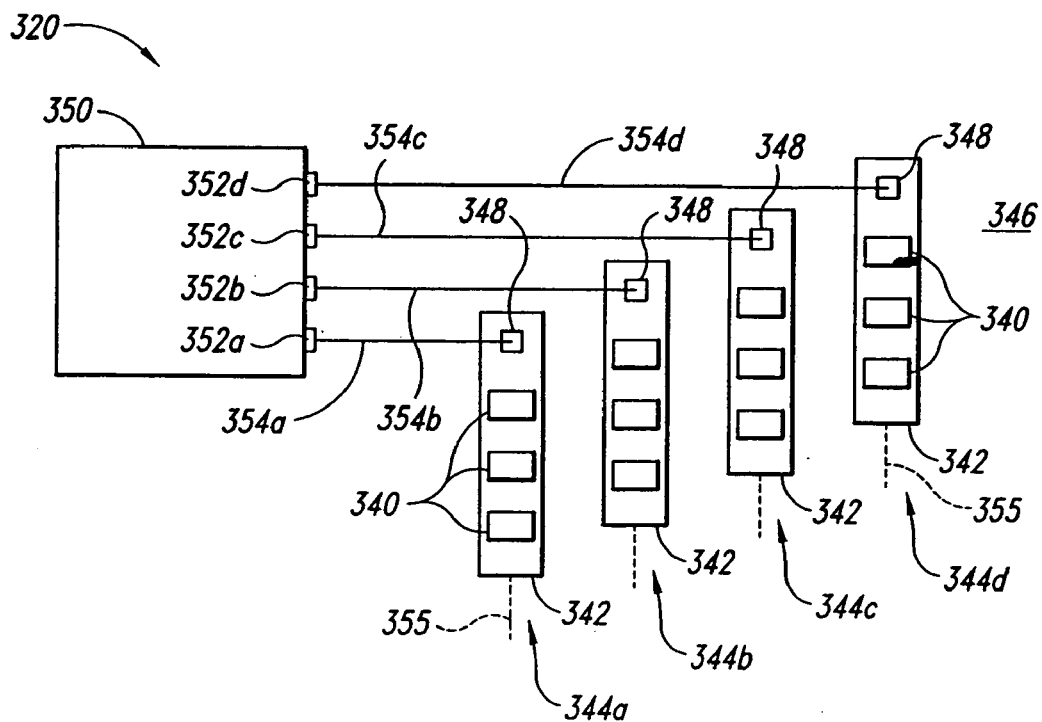
FIG. 5 is a top schematic view of a system memory having memory modules with staged positioning in accordance with yet another embodiment of the invention.

FIG. 5 is a top schematic view of a system memory 320 in accordance with another embodiment of the invention. In this embodiment, the system memory 320 includes a plurality of "staged" memory modules 344. As used herein, the term "staged" refers to the fact that each successive memory module 344 is offset from the preceding memory module along its longitudinal axis 355 by an amount sufficient to provide an unobstructed path for optical signals between the corresponding communications unit 352 of the controller 350 and the T/R unit 348 of the memory module 344.

More specifically, as shown in FIG. 5, the second memory module 344b is attached to the motherboard 346 at a location that is offset along its longitudinal axis 355 (upwardly as shown in FIG. 5) in relation to the position of the first memory module 344a. This provides an unobstructed optical path 354b between the second communications unit 352b and the T/R unit 248 of the second memory module 344b. Similarly, the third memory module 344c is positioned at a location that is offset along its longitudinal axis 355 in relation to the second memory module 344b to provide unobstructed optical path 354c, and fourth memory module 344d is positioned at a location that is offset along its longitudinal axis 355 in relation to the third memory module 344c to provide unobstructed optical path 354d.

Figure 6:
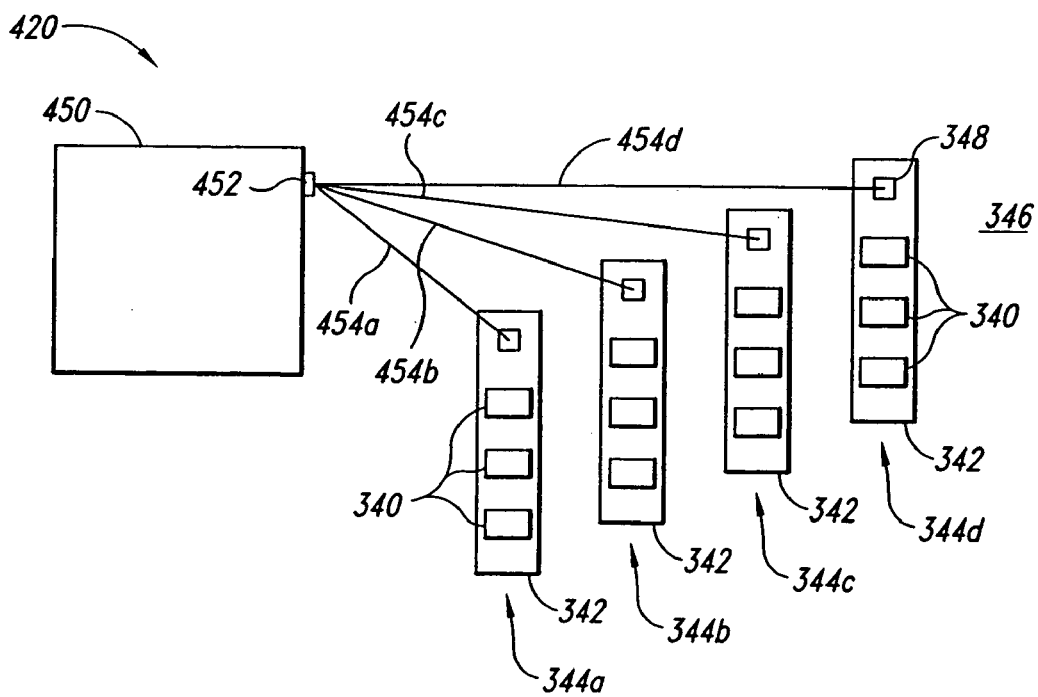
FIG. 6 is a top schematic view of a system memory having memory modules with staged positioning in accordance with a further embodiment of the invention.

FIG. 6 is a top schematic view of a system memory 420 in accordance with a further embodiment of the invention. Like the system memory 320 shown in FIG. 5, the system memory 420 includes a plurality of memory modules 344 that are staged on the motherboard 346. In this embodiment, however, the controller 450 includes a common communications unit 452 that exchanges optical signals with the T/R units 148 on all of the memory modules 344. Thus, the optical paths 454 extend along radial pathways extending outwardly from the communications unit 452 to the T/R units 348.

The system memories 320, 420 shown in FIGS. 5 and 6 provide the above-noted advantages of "free space" optical connection using a uniform memory module configuration. Because the memory modules 344 are staged to provide the desired unobstructed optical paths 354, 454, it is not necessary to have apertures extending through the memory modules. Consequently, the same memory module 344 may be used interchangeably in any of the positions on the motherboard 346, eliminating the need for different configurations of memory modules 344 corresponding to different locations on the motherboard 346. The system memories 320, 420 may therefore be more easily repaired or upgraded, and the costs of maintaining or upgrading the system memory 320 may be reduced compared with alternate system memory embodiments.

Figure 7:
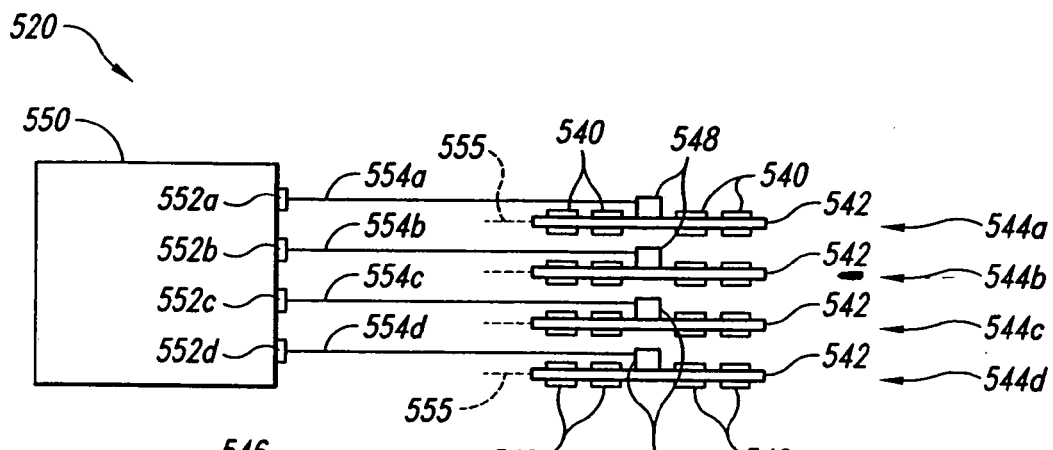
FIG. 7 is a top schematic view of a system memory having a controller positioned proximate the ends of the memory modules in accordance with an alternate embodiment of the invention.

FIG. 7 is a top schematic view of a system memory 520 having a controller 550 positioned at the ends of a plurality of memory modules 544 in accordance with an alternate embodiment of the invention. Each memory module 544 includes a plurality of memory devices 540 (eight shown) attached to a module substrate 542. A T/R unit 548 is attached to and projects outwardly from each module substrate 542. Each T/R unit 548 is operatively coupled to the corresponding memory modules 544 on the module substrate 542 by conductive circuits (not shown) disposed within or on the surface of the module substrate 542.

The controller 550 includes a plurality of communications units 552 that transmit optical signals to, and receive optical signals from, the T/R units 548 along unobstructed optical paths 554. Each T/R unit 548 projects outwardly from its corresponding module substrate 542 by a distance sufficient to exchange signals with the corresponding communications unit 352 of the controller 550 without interference from the neighboring memory devices 540. In the system memory 550 shown in FIG. 7, due to the locations of the T/R units 548 on the module substrates 542, each optical path 554 is approximately parallel with a longitudinal axis 555 of each corresponding module substrate 542.

The system memory 520 shown in FIG. 7 provides the above-noted advantages of "free space" optical connection using a compact, densely-spaced array of memory modules. Because the controller 550 is positioned at the ends of the memory modules 544, there is no need to stage the modules to provide the necessary optical pathways. The memory modules 544 may therefore require less space on the carrier substrate 546 than other system memory embodiments. Furthermore, as with some previously-described embodiments, the memory modules 544 of the system memory 520 are a single configuration which permits the modules to be interchanged in various locations on the carrier substrate 546, simplifying the maintenance and repair of the system memory 520.

Figure 8:
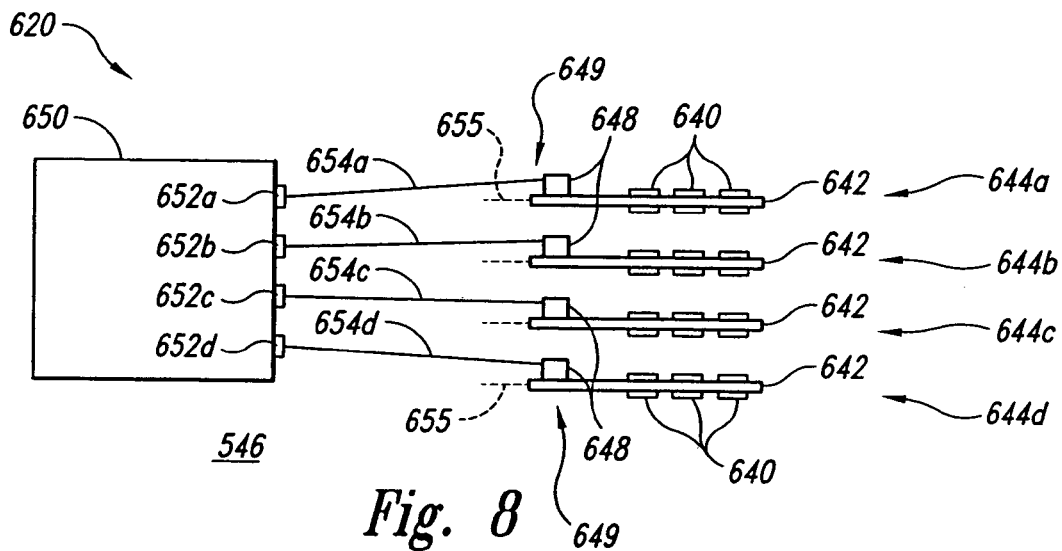
FIG. 8 is a top schematic view of a system memory having a controller positioned proximate the ends of the memory modules in accordance with another alternate embodiment of the invention.
Figure 9:
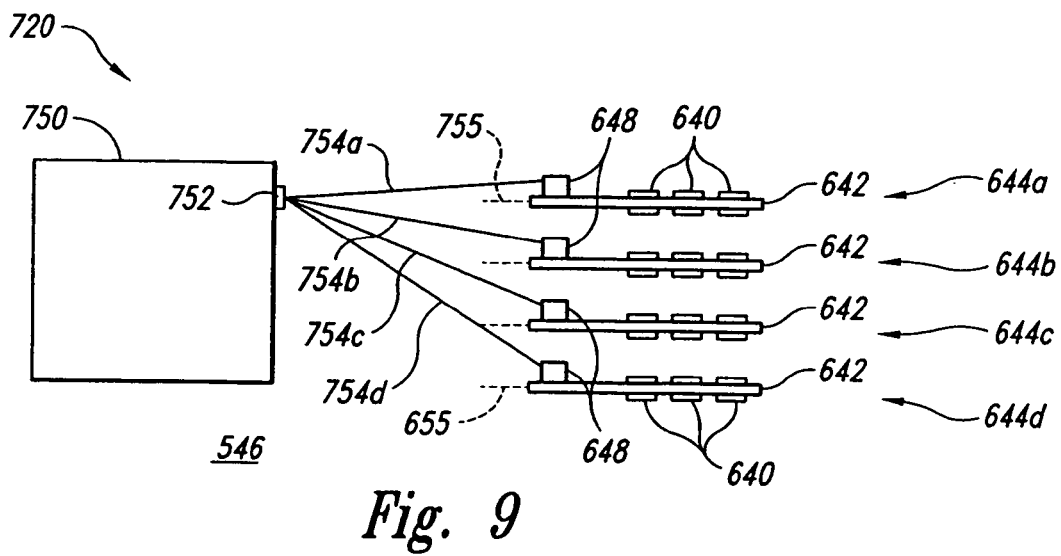
FIG. 9 is a top schematic view of a system memory having a controller positioned proximate the ends of the memory modules in accordance with yet another embodiment of the invention.

FIGS. 8 and 9 are top schematic views of system memories 620, 720 in accordance with further embodiments of the invention. In these embodiments, the system memories 620, 720 include a controller 650, 750 positioned near proximal ends 649 of the memory modules 644. In both of these embodiments, however, the T/R units 648 are attached to the module substrates 642 proximate to the proximal ends 649 of the memory modules 644.

As further shown in FIGS. 8 and 9, because the T/R units are proximate the proximal ends 649, the optical paths 654, 754 from the communications units 652, 752 to the T/R units 648 are not required to be parallel with the longitudinal axes 655 of the module substrates 642. This aspect of the system memories 620, 720 advantageously allows greater design freedom, such as the use of a relatively smaller controller 650 (FIG. 8), or a controller 750 having only a single communications unit 752 (FIG. 9). Another advantage of the system memories 620, 720 is that the T/R units 648 are not required to project outwardly from the module substrates 642 by a distance greater than the heights of the memory devices 640. This aspect may further increase design freedom, and may also allow for reduced spacing and greater density of the memory modules 644 on the carrier substrate 546.

Figure 10:
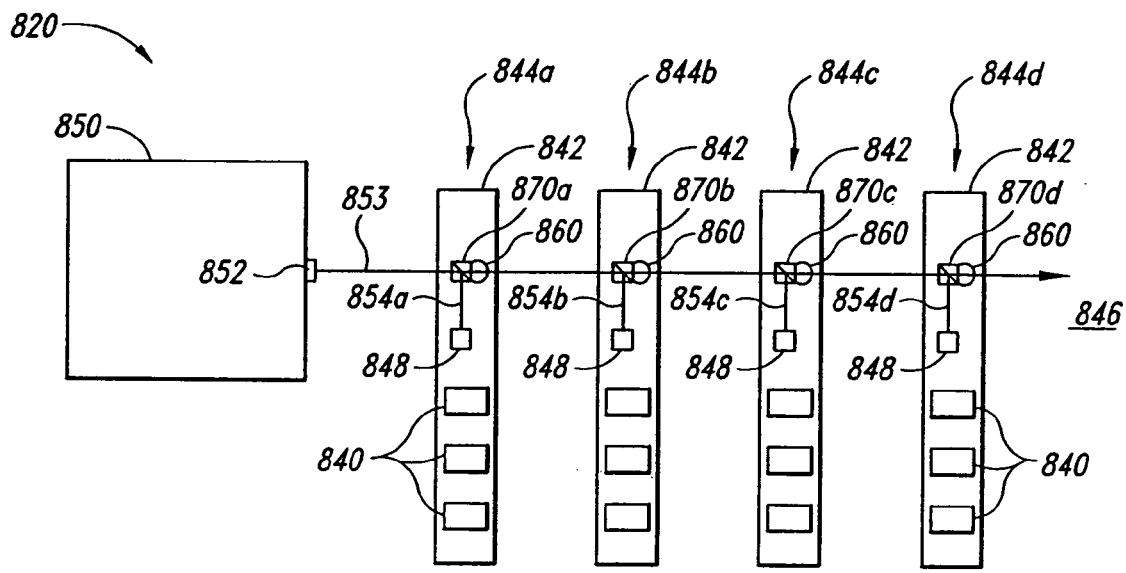
FIG. 10 is a top schematic view of a system memory having memory modules with beam splitters in accordance with an embodiment of the invention.
Figure 11:
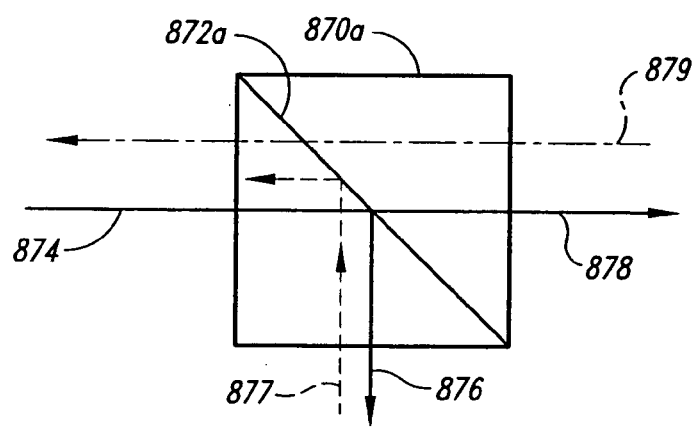
FIG. 11 is an enlarged, top schematic view of a beam splitter of the system memory of FIG. 10.

FIG. 10 is a top schematic view of a system memory 820 in accordance with yet another embodiment of the invention. In this embodiment, each memory module 844 includes a module substrate 842 having an aperture 860 therethrough, and a beam splitter 870 attached to the memory module 844 proximate the aperture 860. FIG. 11 is an enlarged, top schematic view of the beam splitter 870a of the first memory module 844a of FIG. 10. As shown in FIG. 11, each beam splitter 870 includes a surface 872 that reflects a first portion 876 of an incident optical signal 874, and transmits a second portion 878 of the incident optical signal 874. Beam splitters 870 of the type shown in FIG. 11 are commonly known and available in a variety of embodiments, including but not limited to, for example, those types disclosed in U.S. Pat. No. 6,384,974 issued to Joubert et al., U.S. Pat. No. 6,369,951 issued to Spanner, and U.S. Pat. No. 6,350,975 issued to Shirai. In the embodiment shown in FIG. 11, the beam splitter 870 includes a partially-reflective, partially-transmissive surface 872a. As further shown in FIG. 10, each memory module 844 also includes a plurality of memory devices 840 (three shown), and a T/R unit 848 operatively coupled to the memory devices 840.

In operation, memory access optical signals 874 from the communications unit 852 on the controller 850 are transmitted to the memory modules 844 along a common optical path 853 (FIG. 10) to each beam splitter 870. As shown in FIG. 11, with reference to the beam splitter 872a of the first memory module 844a, the memory access optical signal 874 enters the beam splitter 870a and impinges on the surface 872a. A first portion 876 of the optical signal 874 is reflected by the beam splitter 870a along an individual optical path 854a to the T/R unit 848, while a second portion 878 of the optical signal 874 is transmitted through the beam splitter 870a to the beam splitter 870b of the second memory module 844b (or the third or fourth memory modules 844c, 844d). After the T/R unit 848 receives the first portion 876 of the optical signal 874 and accesses the data from the appropriate memory device 840, the T/R unit 848 transmits a responsive optical signal 877 back along the individual optical path 854a to the beam splitter 870a, which reflects at least part of the responsive optical signal 877 back along the common optical path 853 to the controller 850. Similarly, a responsive optical signal 879 from the second memory module 844b (or the third or fourth memory modules 844c, 844d) is transmitted through the beam splitter 870a back along the common optical path 853 to the controller 850. In this way, the memory access signals 874 are transmitted and/or reflected to the T/R units 848 of the memory modules 844, and the responsive data signals 877 are transmitted and/or reflected back to the controller 850.

The system memory 820 provides the above-noted advantages of "free space" optical connection using a single memory module 844 configuration. Thus, the repairability and maintainability of the system memory 820 may be improved over alternate embodiments. Also, since there is no need to stage the memory modules 844 on the motherboard 846, the array of memory modules 844 may be more densely packed and require less space than alternate system memory embodiments.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein can be applied to other apparatus and methods for optically-connected system memories, and not just to the embodiments described above and shown in the accompanying figures. Accordingly, the scope of the invention should be determined from the following claims.

The invention claimed is:

1. A system memory, comprising:
   a carrier substrate;
   a controller attached to the carrier substrate to transmit and receive optical signals;
   a first memory module attached to the carrier substrate proximate the controller, the first memory module including a first module substrate and a first memory device attached to the first module substrate; and
   a second memory module attached to the carrier substrate proximate the first memory module and opposite from the controller, the second memory module including a second module substrate, a second memory device attached to the second module substrate, and an optical transmitter/receiver unit operatively coupled to the second memory device, the first and second memory modules having longitudinal axes in an approximately parallel arrangement with the controller being spaced apart from the first and second memory modules along a direction orthogonal to the longitudinal axes, the first and second memory modules being staged on the carrier substrate such that the second memory module is offset from the first memory module along the longitudinal axis of the second memory module by an amount sufficient to provide an unobstructed path for optical signals between the controller and the optical transmitter/receiver unit of the second memory module.

2. The system memory of claim 1 wherein the first memory module includes an optical transmitter/receiver unit operatively coupled to the first memory device, and wherein the controller includes a first communication unit operable to communicate optical signals to the optical transmitter/receiver unit of the first memory module, and a second communication unit operable to communicate optical signals to the optical transmitter/receiver unit of the second memory module.

3. The system memory of claim 1 wherein the first memory module includes an optical transmitter/receiver unit operatively coupled to the first memory device, and wherein the controller includes a communication unit operable to communicate optical signals to the optical transmitter/receiver units of both the first and second memory modules.

4. The system memory of claim 1, further comprising a third memory module attached to the carrier substrate and positioned proximate the second memory module opposite from the controller, the third memory module including a third module substrate, a third memory device attached to the third module substrate, and an optical transmitter/receiver unit operatively coupled to the third memory device, the first, second, and third memory modules being staged on the carrier substrate such that the third memory module is offset from the first and second memory modules along a longitudinal axis of the third memory module by an amount sufficient to provide a second unobstructed path for optical signals between the controller and the optical transmitter/receiver unit of the third memory module.

5. The system memory of claim 4 wherein the controller includes first, second, and third communication units operable to communicate optical signals to the optical transmitter/receiver units of the first, second, and third memory modules, respectively.

6. The system memory of claim 4 wherein the controller includes a communication unit operable to communicate optical signals to the optical transmitter/receiver units of the first, second, and third memory modules.

7. The system memory of claim 4 wherein the first, second, and third memory modules are substantially parallel, the second memory module being offset from the first memory module along a longitudinal axis of the second memory module by an amount sufficient to provide the unobstructed path, and the third memory module being offset from the second memory module along a longitudinal axis of the third memory module by an amount sufficient to provide the second unobstructed path.

8. The system memory of claim 1 wherein the carrier substrate is adapted for coupling to a computer system data bus.

9. A computer system, comprising:
   a central processing unit;
   a system memory;
   a bus bridge coupled to the central processing unit and the system memory and operable to allow communication between the central processing unit and the system memory, wherein the system memory comprises:
      a carrier substrate;
      a controller attached to the carrier substrate and operable to transfer data signals between the system memory and the central processing unit via the bus bridge, the controller further being operable to transmit and receive optical signals; and
      a first memory module attached to the carrier substrate proximate the controller, the first memory module including a first module substrate and a first memory device attached to the first module substrate; and
      a second memory module attached to the carrier substrate proximate the first memory module and opposite from the controller, the second memory module including a second module substrate, a second memory device attached to the second module substrate, and an optical transmitter/receiver unit operatively coupled to the second memory device, the first and second memory modules having longitudinal axes in an approximately parallel arrangement with the controller being spaced apart from the first and second memory modules along a direction orthogonal to the longitudinal axes, the first and second memory modules being staged on the carrier substrate such that the second memory module is offset from the first memory module along the longitudinal axis of the second memory module by an amount sufficient to provide an unobstructed path for optical signals between the controller and the optical transmitter/receiver unit of the second memory module.

10. The computer system of claim 9 wherein the first memory module includes an optical transmitter/receiver unit operatively coupled to the first memory device, and wherein the controller includes a first communication unit operable to communicate optical signals to the optical transmitter/receiver unit of the first memory module, and a second communication unit operable to communicate optical signals to the optical transmitter/receiver unit of the second memory module.

11. The computer system of claim 9 wherein the first memory module includes an optical transmitter/receiver unit operatively coupled to the first memory device, and wherein the controller includes a communication unit operable to communicate optical signals to the optical transmitter/receiver units of both the first and second memory modules.

12. The computer system of claim 9, further comprising a third memory module attached to the carrier substrate and positioned proximate the second memory module opposite from the controller, the third memory module including a third module substrate, a third memory device attached to the third module substrate, and an optical transmitter/receiver unit operatively coupled to the third memory device, the first, second, and third memory modules being staged on the carrier substrate such that the third memory module is offset from the first and second memory modules along a longitudinal axis of the third memory module by an amount sufficient to provide a second unobstructed path for optical signals between the controller and the optical transmitter/receiver unit of the third memory module.

13. The computer system of claim 12 wherein the controller includes first, second, and third communication units operable to communicate optical signals to the optical transmitter/receiver units of the first, second, and third memory modules, respectively.

14. The computer system of claim 12 wherein the controller includes a communication unit operable to communicate optical signals to the optical transmitter/receiver units of the first, second, and third memory modules.

15. The computer system of claim 12 wherein the first, second, and third memory modules are substantially parallel, the second memory module being offset from the first memory module along a longitudinal axis of the second memory module by an amount sufficient to provide the unobstructed path, and the third memory module being offset from the second memory module along a longitudinal axis of the third memory module by an amount sufficient to provide the second unobstructed path.

16. The computer system of claim 9, further comprising a display coupled to the bus bridge.

17. The computer system of claim 9, further comprising a user interface device coupled to the bus bridge.

18. The computer system of claim 9, further comprising a mass storage device coupled to the bus bridge.

* * * * *